(12) United States Patent
Gollier et al.

(10) Patent No.: US 7,751,045 B2
(45) Date of Patent: Jul. 6, 2010

(54) METHODS AND SYSTEM FOR ALIGNING OPTICAL PACKAGES

(75) Inventors: Jacques Gollier, Painted Post, NY (US); Garrett Andrew Piech, Horseheads, NY (US); Daniel Ohen Ricketts, Corning, NY (US)

(73) Assignee: Corning Incorporated, Corning, NY (US)

( * ) Notice: Subject to any disclaimer, the term of this patent is extended or adjusted under 35 U.S.C. 154(b) by 115 days.

(21) Appl. No.: 12/072,386

(22) Filed: Feb. 26, 2008

(65) Prior Publication Data

US 2009/0190131 A1   Jul. 30, 2009

Related U.S. Application Data

(60) Provisional application No. 61/062,973, filed on Jan. 30, 2008.

(51) Int. Cl.
*G01B 11/00* (2006.01)
(52) U.S. Cl. .................. 356/399; 372/22; 285/15
(58) Field of Classification Search ......... 356/399–401; 372/22; 385/15–52; 359/328
See application file for complete search history.

(56) References Cited

U.S. PATENT DOCUMENTS

| | | | | |
|---|---|---|---|---|
| 6,556,285 | B1 * | 4/2003 | Dickson | .............. 356/121 |
| 6,748,141 | B2 * | 6/2004 | Kennedy et al. | .............. 385/49 |
| 6,970,627 | B2 | 11/2005 | Koishi et al. | |
| 7,059,523 | B1 | 6/2006 | Yavid | |
| 7,457,031 | B1 * | 11/2008 | Gollier | .............. 359/326 |
| 7,561,317 | B2 * | 7/2009 | Weir | .............. 359/201.1 |
| 2008/0019702 | A1 | 1/2008 | Shibatani et al. | .............. 398/182 |
| 2009/0022188 | A1 * | 1/2009 | Almoric et al. | .............. 372/22 |

FOREIGN PATENT DOCUMENTS

| JP | 2003-338795 | 11/2003 |
|---|---|---|
| WO | 2007/134438 A1 | 11/2007 |

\* cited by examiner

*Primary Examiner*—Tarifur R. Chowdhury
*Assistant Examiner*—Isiaka O Akanbi
(74) *Attorney, Agent, or Firm*—Kwadjo Adusei-Poku

(57) ABSTRACT

A method for aligning a beam spot with a waveguide portion of a wavelength conversion device includes scanning a beam spot over the input face of the wavelength conversion device while measuring the output intensity of the device such that an output intensity for each of a plurality of fast scan lines is generated. A first alignment set point is then determined based on the output intensity of each fast scan line. A second scan of the beam spot is then performed over the fast scan line containing the first alignment set point while measuring the output intensity for each point along the fast scan line. A second alignment set point is then determined based on the output intensities measured during the second scan. The beam spot is then aligned with the waveguide portion using the first alignment set point and the second alignment set point.

18 Claims, 2 Drawing Sheets

METHODS AND SYSTEM FOR ALIGNING OPTICAL PACKAGES

CROSS REFERENCE TO RELATED APPLICATIONS

This application claims the benefit of U.S. patent application Ser. No. 61/062,973 filed Jan. 30, 2008, for METHODS AND SYSTEMS FOR ALIGNING OPTICAL PACKAGES, which is incorporated by reference herein.

BACKGROUND OF THE INVENTION

The present invention generally relates to semiconductor lasers, laser controllers, optical packages, and other optical systems incorporating semiconductor lasers. More specifically, the present invention relates to methods and systems for aligning optical packages that include, inter alia, a semiconductor laser and a second harmonic generation (SHG) crystal or another type of wavelength conversion device.

BRIEF SUMMARY OF THE INVENTION

Short wavelength light sources can be formed by combining a single-wavelength semiconductor laser, such as an infrared or near-infrared distributed feedback (DFB) laser, distributed Bragg reflector (DBR) laser, or Fabry-Perot laser, with a light wavelength conversion device, such as a second harmonic generation (SHG) crystal. Typically, the SHG crystal is used to generate higher harmonic waves of the fundamental laser signal. To do so, the lasing wavelength is preferably tuned to the spectral center of the wavelength converting SHG crystal and the output of the laser is preferably aligned with the waveguide portion at the input facet of the wavelength converting crystal.

Waveguide optical mode field diameters of typical SHG crystals, such as MgO-doped periodically poled lithium niobate (PPLN) crystals, can be in the range of a few microns. As a result, the present inventors have recognized that it can be very challenging to properly align the beam from the laser diode with the waveguide of the SHG crystal. Accordingly, one object of the present invention is to provide methods and systems for aligning components in optical packages that utilize a laser diode in conjunction with an SHG crystal or other type of wavelength conversion device to generate shorter wavelength radiation (e.g., green laser light) from a longer wavelength source (e.g., a near-infrared laser diode).

According to one embodiment of the present invention, a method for aligning an optical package having a laser, a wavelength conversion device and at least one adjustable optical component includes using the adjustable optical component to direct a beam spot of the laser onto an input face of the wavelength conversion device. In one embodiment, the adjustable optical component may comprise an adjustable micro-electro mechanical system (MEMS) mirror used in conjunction with a single lens to direct a beam spot of the laser onto an input face of the wavelength conversion device. A first scan of the beam spot across the input face of the wavelength conversion device on a fast scan line is then performed while measuring the output intensity of the wavelength conversion. The first scan is performed by oscillating the adjustable optical component about a first scanning axis at an approximate resonant frequency of the adjustable optical component. The first scan of the beam spot is then stepped along an orthogonal scan line to generate an output intensity for each of a plurality of fast scan lines. A first alignment set point along the orthogonal scan line is then determined based on the output intensities for each of the plurality of fast scan lines. A second scan of the beam spot is then performed over the fast scan line containing the first alignment set point while measuring the output intensity of the wavelength conversion device such that an output intensity for each point along the second scan. A second alignment set point is then determined based on the output intensities measured along the fast scan line containing the first alignment set point. The first alignment set point and the second alignment set point define a position where the beam spot is aligned with the waveguide portion of the wavelength conversion device. The beam spot is then positioned on the waveguide portion of the wavelength conversion device using the first alignment set point and the second alignment set point.

According to another embodiment of the present invention, a method for aligning a beam spot with a waveguide portion of a wavelength conversion device includes rapidly scanning a beam spot across the input face of the wavelength conversion device along a fast scan line by adjusting a position or state of an adjustable optical component while measuring the output intensity of the wavelength conversion device. The rapid scan of the beam spot is then stepped along an orthogonal scan line to generate a plurality of output intensities for each of a plurality of fast scan lines. A first alignment set point along the orthogonal scan line is then determined based on the average output intensity for each fast scan line. A slow scan of the beam spot is then performed over the fast scan line containing the first alignment set point while measuring the output intensity of the wavelength conversion device such that a plurality of output intensity for a plurality of points along the fast scan line containing the first alignment set point are generated. A second alignment set point is then determined based on the output intensities measured along the fast scan line containing the first alignment set point. The first alignment set point and the second alignment set point define a position where the beam spot is aligned with the waveguide portion of the wavelength conversion device. The beam spot is then positioned on the waveguide portion of the wavelength conversion device using the first alignment set point and the second alignment set point.

In another embodiment of the present invention, an optical system includes a laser, a wavelength conversion device, a lens assembly, one or more adjustable optical components, an optical detector, and a controller. The wavelength conversion device includes a wave guide portion and an input face. The optical detector is coupled to the controller and positioned to measure the output intensity of the wavelength conversion device. The lens assembly and the adjustable optical component are configured to direct a beam spot of the laser towards the input face of the wavelength conversion device. The controller is configured to control the position of the adjustable optical component about a first scanning axis and a second scanning axis such that the beam spot of the laser may be positioned on the input face of the waveguide conversion device. The controller may also be configured to: perform a first scan of the beam spot across the input face of the waveguide device along a fast scan line while stepping the first scan along an orthogonal scan line; determine a first alignment set point based on a plurality of output intensities for a plurality of fast scan lines; perform a second scan of the beam spot over the fast scan line containing the first alignment set point; and determine a second alignment set point based on the output intensitics measured during the second scan. The controller may also be configured to position the adjustable optical component using the first and second alignment set points such that the beam spot is aligned with the waveguide portion of the wavelength conversion device.

Additional features and advantages of the invention will be set forth in the detailed description which follows and, in part, will be readily apparent to those skilled in the art from that description or recognized by practicing the invention as described herein, including the detailed description which follows, the claims, as well as the appended drawings. It is to be understood that both the foregoing general description and the following detailed description present embodiments of the invention and are intended to provide an overview or framework for understanding the nature and character of the invention as it is claimed.

BRIEF DESCRIPTION OF THE DRAWINGS

The following detailed description of specific embodiments of the present invention can be best understood when read in conjunction with the following drawings, where like structure is indicated with like reference numerals and in which.

DETAILED DESCRIPTION OF THE ILLUSTRATIVE EMBODIMENTS

Figure 1:
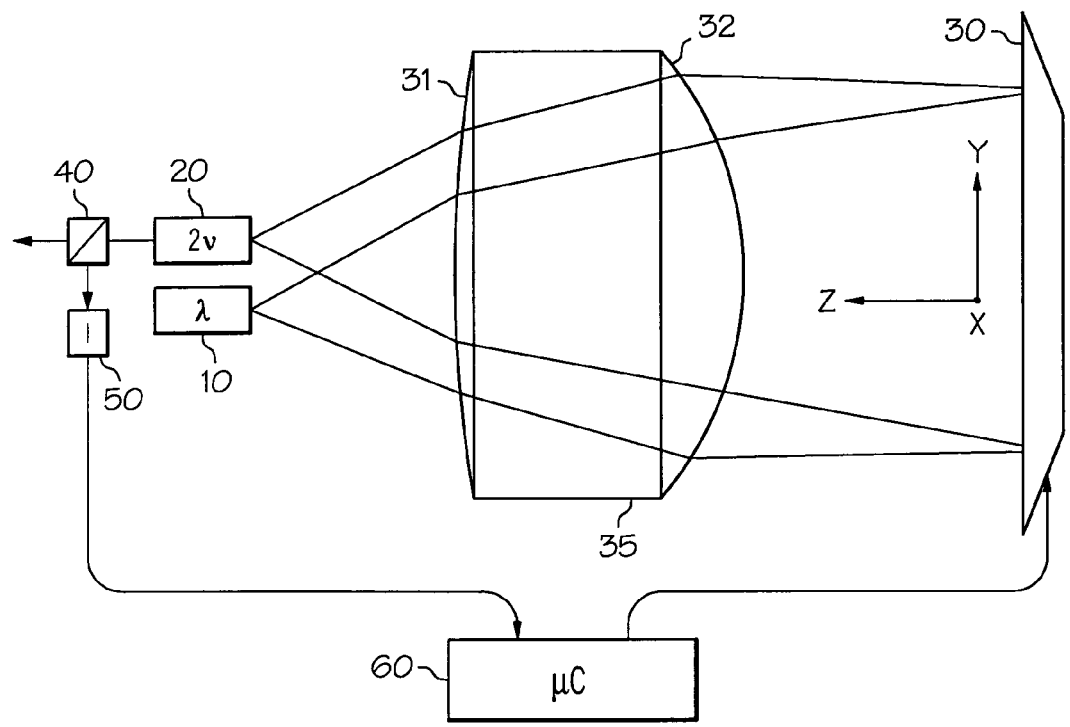
FIG. 1 is a schematic illustration of a MEMS mirror-enabled optical alignment package according to one embodiment of the present invention.

Referring initially to FIG. 1, although the general structure of the various types of optical packages in which the concepts of particular embodiments of the present invention can be incorporated is taught in readily available technical literature relating to the design and fabrication of frequency or wavelength-converted semiconductor laser sources, the concepts of particular embodiments of the present invention may be conveniently illustrated with general reference to an optical package including, for example, a semiconductor laser 10 (labeled "λ" in FIG. 1) and a wavelength conversion device 20 (labeled "2ν" in FIG. 1). In the configuration depicted in FIG. 1, the near infrared light emitted by the semiconductor laser 10 is coupled into a waveguide portion of the wavelength conversion device 20 by one or more adjustable optical components 30 and a suitable lens assembly 35, which lens assembly 35 may comprise one or more optical elements of unitary or multi-component configuration. The optical package illustrated in FIG. 1 is particularly useful in generating a variety of shorter wavelength laser beams from a variety of longer wavelength semiconductor lasers and can be used, for example, as a visible laser source in a laser projection system.

Figure 2:
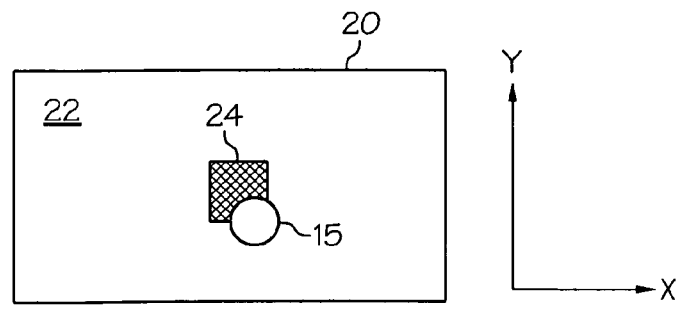
FIG. 2 is a schematic illustration of a beam spot on an input face of a wavelength conversion device.

The adjustable optical component 30 is particularly helpful because it is often difficult to focus the output beam emitted by the semiconductor laser 10 into the waveguide portion of the wavelength conversion device 20. For example, waveguide optical mode field diameters of typical SHG crystals, such as MgO-doped periodically poled lithium niobate (PPLN) crystals, can be in the range of a few microns. Referring to FIGS. 1 and 2 collectively, the lens assembly 35 cooperates with the adjustable optical component 30 to generate a beam spot 15 of comparable size on the input face 22 of the wavelength conversion device 20. The adjustable optical component 30 is configured to introduce beam angular deviation by adjusting a drive mechanism of the adjustable optical component and, as such, can be used to actively align the beam spot 15 with the waveguide portion 24 of the wavelength conversion device 20 by altering the position of the beam spot 15 on the input face 22 of the wavelength conversion device 20 until it is aligned with the waveguide portion 24 of the wavelength conversion device 20.

In one embodiment, beam alignment may be monitored by providing, for example, a beam splitter 40 and an optical detector 50 in the optical path of the wavelength conversion device 20. The optical detector 50 may be operably connected to a microcontroller or controller 60 (labeled "μc" in FIG. 1) such that an output signal from the optical detector 50 is received by the controller 60. The controller 60 may be configured to control the position or state of the adjustable optical component 30 by adjusting a drive mechanism of the adjustable optical component and, as such, position the output beam of the semiconductor laser 10 on the input face 22 of the wavelength conversion device 20. In one embodiment the controller 60 may be used to control the position or state of the adjustable optical component 30 as a function of the output signal received from the optical detector 50. In another embodiment, the controller 60 may be used to perform an alignment routine such that the beam spot 15 of the semiconductor laser 10 is aligned with the waveguide portion 24 of the wavelength conversion device 20.

The adjustable optical component illustrated schematically in FIG. 1 can take a variety of conventional or yet to be developed forms. For example, it is contemplated that the drive mechanism of the adjustable optical component 30 may comprise one or more movable micro-opto-electromechanical systems (MOEMS) or micro-electro-mechanical system (MEMS) operatively coupled to a mirror. The MEMS or MOEMS devices may be configured and arranged to vary the position of the beam spot 15 on the input face 22 of the wavelength conversion device 20. Since the mirror is located in the collimated or nearly-collimated beam space of the optical system, adjustment of the mirror angle will result in a change in the x/y position of the refocused beam spot at the input face of the wavelength conversion device. Used of MEMS or MOEMS devices enables adjustment of the refocused beam spot position to be done extremely rapidly over large ranges. For example, a MEMS mirror with a +/− 1 degree mechanical deflection, when used in conjunction with a 3 mm focal length lens, may allow the beam spot to be angularly displaced +/− 100 μm on the input face of the wavelength conversion device. The adjustment of the beam spot may be done at frequencies on the order of 100 Hz to 10 kHz due to the fast response time of the MEMS or MOEMS device. Alternatively or additionally, the adjustable optical component 30 may comprise one or more liquid lens components configured for beam steering and/or beam focusing. Still further, it is contemplated that the adjustable optical component 30 may comprise one or more mirrors and/or lenses mounted to micro-actuators. In one contemplated embodiment, the adjustable optical component takes the form of a movable or adjustable lens in the lens assembly 35 and the otherwise adjustable optical component 30 takes the form of a fixed mirror.

In the optical configuration illustrated in FIG. 1, the adjustable optical component 30 is a micro-opto-electromechanical mirror incorporated in a relatively compact, folded-path optical system. In the illustrated configuration, the adjustable optical component 30 is configured to fold the optical path such that the optical path initially passes through the lens assembly 35 to reach the adjustable optical component 30 as a collimated or nearly collimated beam and subsequently returns through the same lens assembly 35 to be focused on the wavelength conversion device 20. This type of optical configuration is particularly applicable to wavelength converted laser sources where the cross-sectional size of the laser beam generated by the semiconductor laser is close to the size of the waveguide on the input face of the wavelength conversion device 20, in which case a magnification close to one would yield optimum coupling in focusing the beam spot on the input face of the wavelength conversion device 20. For the purposes of defining and describing the present invention, it is noted that reference herein to a "collimated or nearly collimated" beam is intended to cover any beam configuration where the degree of beam divergence or convergence is reduced, directing the beam towards a more collimated state.

The lens assembly 35 can be described as a dual function, collimating and focusing optical component because it serves to collimate the divergent light output of the laser and the refocus the laser light propagating along the optical path of the package into the waveguide portion of the wavelength conversion device. This dual function optical component is well suited for applications requiring magnification factors close to one because a single lens assembly 35 is used for both collimation and focusing. More specifically, as is illustrated in FIG. 1, laser light output from the semiconductor laser 10 is, in sequence, refracted at the first face 31 of the lens assembly 35, refracted at the second face 32 of the lens assembly 35, and reflected by the adjustable optical component 30 in the direction of the lens assembly 35. Once the laser light is reflected back in the direction of the lens assembly 35, it is first refracted at the second face 32 of the lens assembly 35 and subsequently refracted at the first face 31 of the lens assembly 35, for focusing on the input face of the wavelength conversion device 20.

In particular embodiments of the present invention, the adjustable optical component 30 is placed close enough to the image focal point of the lens assembly 35 to ensure that the principle ray incident on the input face 22 of the wavelength conversion device 20 is approximately parallel to the principle ray at the output of the optical package. It may also be shown that the configuration illustrated in FIG. 1 also presents some advantages in term of aberration. Indeed, when the output face of the semiconductor laser 10 and the input face of the wavelength conversion device 20 are positioned in approximate alignment with the object focal plane of the lens assembly 35 and the output waveguide of the semiconductor laser 10 and the input waveguide of the wavelength conversion device 20 are symmetric with respect to the optical axis of the lens assembly 35, it is contemplated that anti symmetric field aberrations, such as coma, can be automatically corrected.

Figure 3:
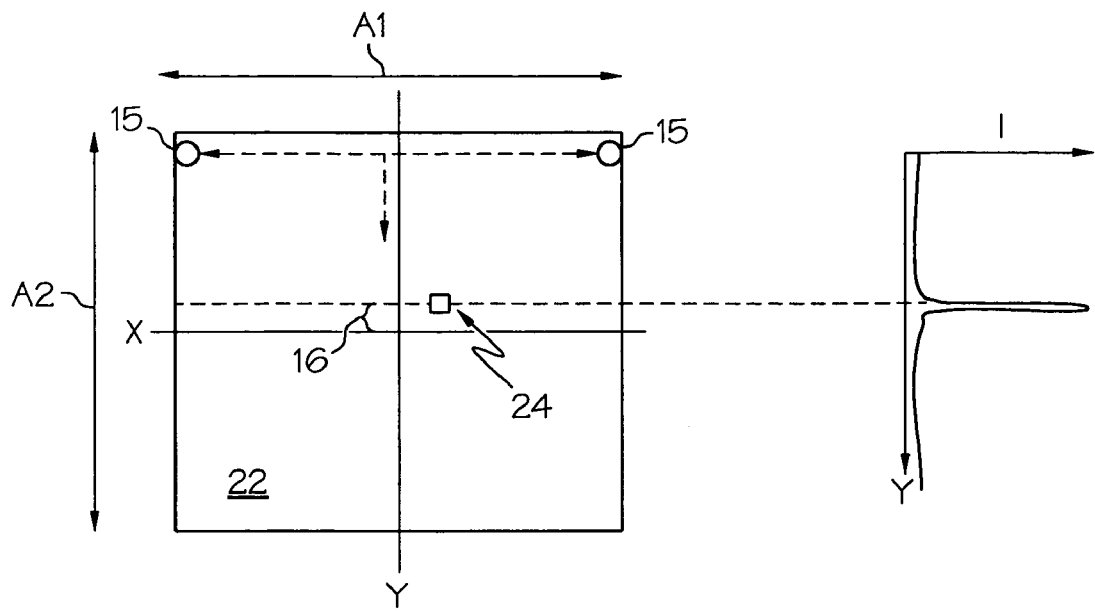
FIG. 3 is a schematic illustration of a rapid scan of the beam spot over an input face of the wavelength conversion.
Figure 4:
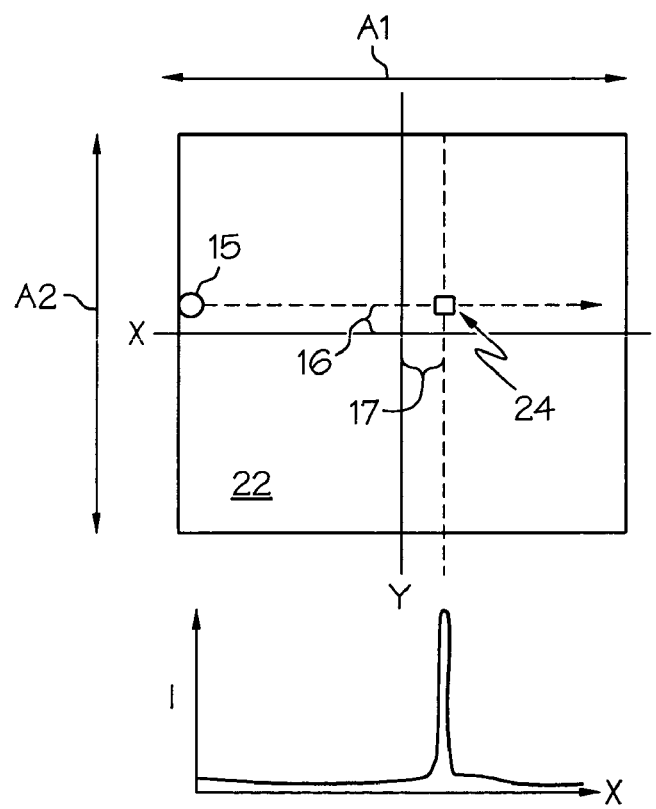
FIG. 4 is a schematic illustration of a slow scan of the beam spot over a fast scan line containing the first alignment set point on an input face of the wavelength conversion device.

Referring now to FIGS. 1 and 3-4, in one embodiment, a method of aligning the beam spot 15 of the semiconductor laser 10 with the waveguide portion 24 of the wavelength conversion device 20 comprises traversing the beam spot 15 across the input face 22 of the wavelength conversion device 20 while monitoring the output of the wavelength conversion device 20 in order to determine a first alignment set point 16 and a second alignment set point 17 where the beam spot 15 is aligned with the waveguide portion 24 of the wavelength conversion device 20.

As discussed herein, the output intensity of the wavelength conversion device 20 may be monitored by positioning a beam splitter 40 and optical detector 50 proximate the output of the wavelength conversion device 20. In one embodiment, the optical detector 50 may be a photodiode configured to measure the intensity of electro-magnetic radiation coupled through the wavelength conversion device 20. The electromagnetic radiation may comprise infrared radiation, such as the infrared radiation emitted from the semiconductor laser 10, or visible light radiation, such as the green light emitted from the wavelength conversion device 20.

In order to align the beam spot 15 of the semiconductor laser 10 with the waveguide portion 24 of the wavelength conversion device 20 the beam spot 15 is focused on the input face 22 of the wavelength conversion device 20. This may be accomplished by positioning the lens assembly 35 relative to the wavelength conversion device 20 and the semiconductor laser 10 such that the input face 22 of the wavelength conversion device 20 and the output face of the semiconductor laser 10 are substantially co-planar with the focal plane of the lens assembly 35.

With the beam spot focused on the input face 22 of the wavelength conversion device 20, a relatively rapid scan of the beam spot 15 (as compared to a subsequent slow scan of the beam spot 15) is then performed over the input face 22 of the wavelength conversion device 20 along a fast scan line (A1), as shown in FIG. 3, while the output intensity (I) of the wavelength conversion device 20 is measured by the optical detector 50. To facilitate the rapid scan of the beam spot 15 over the input face 22 of the wavelength conversion device 20 the controller 60 rapidly adjusts the position or state of the adjustable optical component 30 about a first scanning axis which, in turn, causes the beam spot 15 incident on the input face 22 of the wavelength conversion device 20 to traverse the input face 22 of the wavelength conversion device 20 along a fast scan line. In one embodiment, the adjustable optical component is oscillated about a first scanning axis by applying an oscillating signal, such as a sinusoidal signal, square wave signal, saw-tooth signal or the like, to a drive mechanism, such as a micro-actuator or MEMS device, to oscillate the adjustable optical component 30 about the first scanning axis. By way of reference, the first scanning axis of the adjustable optical component 30 corresponds to an axis parallel to the y-axis of the coordinate system shown in FIGS. 1 and 3-4 while the fast scan line along the input face 22 corresponds to a line parallel to the x-axis of the coordinate system depicted in FIGS. 1 and 3-4.

In one embodiment, the drive mechanism of the adjustable optical component 30 is oscillated about the first scanning axis at a frequency significantly higher than the signal integration of the optical detector 50 positioned at the output of the wavelength conversion device 20 such that the measured output intensity (I) of the wavelength conversion device is representative of the average output intensity of the wavelength conversion device 20 over the fast scan line along which the beam spot 15 traverses. In another embodiment, the signal integration of the optical detector 50 is sufficiently faster than the frequency at which the adjustable optical component is oscillated and, accordingly, the output intensity (I) of the wavelength conversion device is representative of the maximum output intensity over the fast scan line along which the beam spot 15 traverses.

In another embodiment, the drive mechanism of the adjustable optical component 30 may be oscillated at its approximate resonant frequency. This may be accomplished by oscillating the drive mechanism of the adjustable optical component with an oscillating signal having a frequency at or near the first eigen frequency of the drive mechanism of the adjustable optical component. For example, in one embodiment where the adjustable optical component is a MEMS mirror having a resonant frequency of about 500 Hz, the MEMS mirror may be oscillated about the first scanning axis at about 500 Hz by applying a sinusoidal signal having a frequency of about 500 Hz to the corresponding axis of the MEMS mirror. When the adjustable optical component comprises a MEMS mirror, oscillating the MEMS mirror at an approximate resonant frequency provides a large amplitude displacement of the mirror about a scanning axis at high frequency (and a large displacement of the beam spot on the face of the wavelength conversion device) with minimum power consumption.

The controller 60 steps the rapid scan of the beam spot 15 over the input face 22 of the wavelength conversion device 20 by rotating the adjustable optical component 30 about a second scanning axis perpendicular to the first scanning axis. This causes the rapid scan of the beam spot 15 to traverse across the input face 22 of the wavelength conversion device 20 along an orthogonal scan line (e.g., A2 in FIGS. 3 and 4) such that an average output intensity or maximum output intensity is generated by the optical detector 50 for each of a plurality of fast scan lines on the input face 22 of the wavelength conversion device. By way of reference, the second scanning axis of the adjustable optical component 30 corresponds to an axis parallel to the x-axis of the coordinate system shown in FIGS. 1 and 3-4 while the orthogonal scan line along the input face 22 of the wavelength conversion device 20 corresponds to a line parallel to the y-axis of the coordinate system depicted in FIGS. 1 and 3-4. The average output intensity or maximum output intensity for each of the plurality of fast scan lines are then recorded by the controller 60 as a function of the orientation of the adjustable optical component 30 about the second scanning axis as shown in FIG. 3.

While specific reference has been made herein to the orientation of the fast scan line, the orthogonal scan line, the first scanning axis, and the second scanning axis with respect to the coordinate system depicted in FIGS. 1 and 3-4, it should be understood that, unless otherwise stated herein, no particular limitation is intended as to the orientation of any particular line or scanning axis with reference to a specific coordinate system. However, it should be understood that the fast scan line along the input face 22 of the wavelength conversion device 20 will be generally perpendicular to the orthogonal scan line along the input face 22 and the first scanning axis of the adjustable optical component 30 will be generally perpendicular to the second scanning axis of the adjustable optical component 30. Moreover, the first scanning axis of the adjustable optical component 30 will be generally perpendicular to the fast scan lines along the input face 22 and the second scanning axis of the adjustable optical component 30 will be generally perpendicular to the orthogonal scan line along the input face 22.

In one embodiment, after the rapid scan of the beam spot 15 over the input face 22 of the wavelength conversion device 20 is complete, the controller 60 determines a first alignment set point 16 based on the average output intensity of each of the plurality of fast scan lines. As shown in FIG. 3, the waveguide portion 24 of the wavelength conversion device 20 is positioned along the fast scan line having the greatest average output intensity. Accordingly, the first alignment set point 16 is determined to corresponds to a point along the orthogonal scan line through which the fast scan line containing the waveguide portion 24 of the wavelength conversion device 20 passes which, in turn, corresponds to a rotational orientation of the adjustable optical component 30 about the second scanning axis such that the beam spot 15 is positioned on the fast scan line containing the waveguide portion 24 of the wavelength conversion device 20. Alternatively, when the measured output of the intensity is the maximum output intensity for each of the fast scan line, the first alignment set point 16 is determined to correspond to a point along the orthogonal scan line through which the fast scan line having the greatest maximum output intensity of the plurality of fast scan lines passes.

Referring now to FIG. 4, after the first alignment set point is determined, the beam spot 15 is then scanned across the input face 22 of the wavelength conversion device 20 along the fast scan line containing the first alignment set point. In one embodiment, a relatively slow scan (as compared to the rapid scan) of the beam spot 15 along the fast scan line containing the first alignment set point 16 is performed. To facilitate the slow scan of the beam spot 15 over the input face 22 of the wavelength conversion device 20 the controller 60 first orients the adjustable optical component 30 about the second scanning axis such that the beam spot 15 is located on the fast scan line containing the first alignment set point 16. The controller 60 then traverses the beam spot 15 over the fast scan line containing the first alignment set point 16 while measuring the output intensity (I) of the wavelength conversion device using the intensity sensor 50. The controller 60 traverses the beam spot 15 over the fast scan line by incrementally rotating the adjustable optical component 30 about the first scanning axis such that the beam spot 15 is positioned at discrete points along the fast scan line containing the first alignment set point 16. Accordingly, the output of the optical detector 50 during the slow scan is representative of the output of the wavelength conversion device 20 for each discrete position of the beam spot 15 along the fast scan line. The slow scan of the beam spot 15 along the fast scan line may be facilitated by applying a signal to a micro-actuator or MEMS device to rotate the adjustable optical component 30 about the first scanning axis and thereby slowly scan the beam spot 15 over the fast scan line. The signal used in the slow scan may be such that, if the beam spot 15 has a width W1 in the direction of the fast scan line and the waveguide portion 24 has a width W2 along the fast scan line, then the scanning period T (e.g., the time it takes for the beam spot to traverse along the scan line) multiplied by the scan speed V (e.g., speed at which the beam spot traverses the fast scan line) is less than the sum W1+W2 (e.g., V*T<(W1+W2)). The output intensity (I) corresponding to each discrete position of the beam spot 15 is recorded by the controller 60 during the slow scan as a function of the orientation of the adjustable optical component 30 about the first scanning axis as shown in FIG. 4.

In another embodiment, after the first alignment set point is determined, a rapid scan of the beam spot 15 is then performed across the input face 22 of the wavelength conversion device 20 along the fast scan line containing the first alignment set point to determine a second alignment set point. To facilitate the rapid scan of the beam spot 15 over the fast scan line containing the first alignment set point, the controller first orients the adjustable optical component 30 about the second scanning axis such that the beam spot 15 is located on the fast scan line containing the first alignment set point 16. The controller 60 then rapidly traverses the beam spot 15 over the fast scan line containing the first alignment set point 16 by oscillating the adjustable optical component about the first scanning axis while measuring the output intensity (I) of the wavelength conversion device using the optical detector 50, in a similar manner as described hereinabove. The signal integration of the optical detector 50 may be sufficiently faster than the frequency at which the adjustable optical component is oscillated such that the output of the optical detector corresponds to the output intensity (I) for each discrete point along the fast scan line. The output intensity corresponding to each discrete position of the beam spot 15 along the fast scan line is recorded by the controller 60 during the rapid scan as a function of the orientation of the adjustable optical component 30 about the first scanning axis as shown in FIG. 4.

After the scan (either rapid or slow) of the beam spot 15 over the fast scan line containing the first alignment set point 16 is complete, the controller 60 determines a second alignment set point 17 based on the output intensities received from the optical detector 50 during the scan. As shown in FIG. 4, the waveguide portion 24 of the wavelength conversion device 20 is positioned at a point on the fast scan line corresponding to the beam spot position having the greatest output intensity. Accordingly, the second alignment set point 17 is determined to be the position of the beam spot 15 along the fast scan line corresponding to the greatest output intensity of the wavelength conversion device 20 which, in turn, corresponds to a rotational orientation of the adjustable optical component 30 about the first scanning axis such that the beam spot 15 is positioned on the waveguide portion 24 of the wavelength conversion device 20.

In one embodiment, after the second alignment set point 17 is determined, the second alignment set point 17 may be adjusted or tuned by measuring the output intensity of the wavelength conversion device 20 with the beam spot 15 positioned on points adjacent to the point on the fast scan line corresponding to the greatest output intensity and/or with the beam spot 15 positioned between the point having the greatest output intensity adjacent points. The second alignment set point 17 may then be interpolated along the fast scan line based on the measured output intensities of the adjacent points. In this manner the second alignment set point may be adjusted and tuned such that the output intensity of the wavelength conversion device is maximized.

In another embodiment, after the second alignment set point 17 is determined, the second alignment set point 17 may be adjusted or tuned by performing another scan of the beam spot 15 over the fast scan line containing both the first and second alignment set points while measuring the output intensity of the wavelength conversion device 20. The output intensity of the wavelength conversion device 20 may be recorded by the controller as a function of the orientation of the adjustable optical component about the first scanning axis. For this scan, the range of the scan along the fast scan line containing the first alignment set point 16 may be limited to that portion of the fast scan line containing the second alignment set point 17. The signal applied to the adjustable optical component may be such that the scanning period T multiplied by the speed V at which the beam spot traverses the fast scan line is less than the mode diameter D of the waveguide portion 24 of the wavelength conversion device (e.g., V*T<D). Alternatively, the product V*T may be less than a predetermined percentage of the mode diameter. For example, in one embodiment, the product V*T may be less than 10% of the mode diameter (e.g., V*T<0.10*D). The second alignment set point 17 may then be adjusted or tuned based on the output intensities and orientations recorded during the scan such that the output intensity of the wavelength conversion device is maximized.

After both the first alignment set point 16 and the second alignment set point 17 have been determined and adjusted, the controller 60 may then utilize the first alignment set point 16 and the second alignment set point 17 to orient the adjustable optical component 30 about each of the first scanning axis and the second scanning axis such that the beam spot 15 is incident on the waveguide portion 24 of the wavelength conversion device 20.

It should now be understood that the method described herein provides for the fast and efficient alignment of the beam spot 15 of the semiconductor laser 10 with the waveguide portion 24 of the wavelength conversion device 20. Referring to FIG. 3, by way of example, if the input face 22 of the wavelength conversion device 20 comprises N spatial locations on each of the fast scan line and the orthogonal scan line, and each spatial location roughly corresponds to the cross sectional area of the waveguide portion 24 of the wavelength conversion device 20, then the waveguide portion 24 may be positioned on the input face 22 at one of up to $N^2$ discrete spatial locations. However, the present inventors have discovered that, using the rapid scan/slow scan alignment methodology described herein, only 2N discrete spatial measurements need to be made in order to locate the waveguide portion 24 and thereby align the beam spot 15 with the waveguide portion 24 of the wavelength conversion device 20.

Further, the present inventors have also discovered that scanning the beam spot over the input face of the wavelength conversion device using the approximate resonant frequency of the adjustable optical component significantly reduces the time required to accurately align the beam spot with the waveguide portion of the wavelength conversion device.

In practice, the alignment method of the present invention may be employed during the manufacture of the optical package. By way of example, in one embodiment, to assemble the optical package the wavelength conversion device 20 is assembled atop the semiconductor laser 10 such that the output face of the semiconductor laser 10 and the input face of the wavelength conversion device 20 are substantially co-planar.

The adjustable optical component 30 and the lens assembly 35 are then positioned in the x/y plane and z direction with respect to the wavelength conversion device 20 and semiconductor laser 10. Each of the adjustable optical component 30 and lens assembly 35 are positioned in the x/y plane such that the centerline of each component is within a few hundred microns of the centerline between the semiconductor laser 10 and the wavelength conversion device 20.

When the focal length of the lens assembly 35 is well characterized, the lens assembly 35 and adjustable optical component 30 may be positioned in the optical package along the z-direction such that the input face 22 of the wavelength conversion device 20 and the output face of the semiconductor laser 10 are substantially in or coplanar with the object focal plane of the lens assembly 35. For example, in one embodiment, the focal length of the lens assembly 35 is about 3 mm. Therefore, the components of the optical package are positioned such that the distance between the lens assembly 35 and the input face 22 of the wavelength conversion device 20 and the output face of the semiconductor laser 10 may be about 3 mm. The adjustable optical component 30 is similarly positioned relative to the lens assembly 35. Once each of the components are properly positioned in the optical package, each of the lens assembly 35, the wavelength conversion device 20/semiconductor laser 10 combination and adjustable optical component 30 are then permanently fixed into place in the optical package using epoxy, laser welding, or other attachment techniques as may be presently known or subsequently developed.

After the components of the optical package are fixed into place, the optical package may be energized and the alignment method described herein may be performed by the controller 60 such that the beam spot 15 of the semiconductor laser 10 is aligned with the waveguide portion 24 of the wavelength conversion device 20. It should be understood that the alignment method described herein may be used to align the optical package during assembly of the optical package or after the entire optical package has been assembled and the optical package is powered on for the first time.

In another embodiment, when the focal length of the lens assembly 35 is not well characterized, the method of the present invention may be used in conjunction with feedback loop alignment techniques to fine tune the alignment of the beam spot 15 with the wavelength conversion device 20 as each component of the optical package is brought into alignment. For example, when the focal length of the lens assembly 35 is not well characterized, the lens assembly 35 and adjustable optical component 30 may be inserted into the optical package and positioned in rough alignment with the wavelength conversion device 20 and semiconductor laser 10. In this technique, the alignment of the components in the x/y plane need only be within a few hundred microns while the alignment of the lens assembly 35 with the input face 22 of the wavelength conversion device 20 should be close to one focal length of the lens assembly 35.

With the components in rough alignment, the optical package is powered on and the alignment method describe herein is performed by the controller to align the beam spot 15 with the waveguide portion 24 of the wavelength conversion device 20. The lens assembly 35 and the adjustable optical component 30 may then be adjusted in the x/y plane and z direction to optimize the properties of the optical package while the controller 60 utilizes a separate feedback control loop alignment techniques to dynamically maintain the alignment of the beam spot 15 with the wavelength conversion device 20 as the position of each of the lens assembly 35 and the adjustable optical component 30 are adjusted. Once the components of the optical package are properly oriented in the x/y plane and z directions, each component is fixed in to place.

In another embodiment, the method of the present invention may be utilized to align or realign the beam spot with the adjustable optical component after the optical package has been assembled and throughout the life of the optical package. For example, realignment of the beam spot with the waveguide may be necessary if the assembled optical package is exposed to thermal or environmental conditions, mechanical shock or other conditions which may adversely impact beam-waveguide alignment. To align the beam spot with the waveguide portion of the optical package, the alignment methods described herein may be performed under control of the controller operatively connected to the optical package. In one embodiment, use of the alignment method described herein to realign the optical package may be performed automatically, such as when the controller detects a reduction in the output intensity of the optical package. In another embodiment, the alignment method may be periodically performed throughout the life of the optical package. In yet another embodiment, use of the alignment method described herein to realign the optical package may be initiated by a user.

It should be understood that, when the methods described herein are used to align the beam spot with the waveguide portion during initial assembly of the optical package, the actuator used to adjust the position of the adjustable optical component may be external to the optical package and operatively attached to the adjustable optical component for purposes of alignment only.

Further, it should also be understood that, when the methods described herein are used to align the beam spot with the waveguide portion during the initial assembly of the optical package, the adjustable optical component may be adjusted by an internal actuator, integral with the optical package, such as when the adjustable optical component is a MEMS or MOEMS actuated mirror.

It should now be understood that the method described herein is suitable for aligning a beam spot of a semiconductor laser with a waveguide portion of a wavelength conversion device. The alignment method is particularly suited for performing the initial alignment of the beam spot with the wavelength conversion device during assembly of the optical package. However, it should be understood that the alignment method may also be used to maintain alignment or perform realignment of the beam spot with the wavelength conversion device during operation of the optical package or at any time during the life-cycle of the package.

It is contemplated that the methods of the present invention may be applicable to color image-forming laser projection systems, laser-based displays such as heads-up displays in automobiles, or any laser application where optical alignment and/or wavelength tuning are issues. It is further contemplated that the alignment methods discussed herein will have utility in conjunction with a variety of semiconductor lasers, including but not limited to DBR and DFB lasers, Fabry-Perot lasers, and many types of external cavity lasers.

It is to be understood that the preceding detailed description of the invention is intended to provide an overview or framework for understanding the nature and character of the invention as it is claimed. It will be apparent to those skilled in the art that various modifications and variations can be made to the present invention without departing from the spirit and scope of the invention. Thus, it is intended that the present invention cover the modifications and variations of this invention provided such modifications and variations come within the scope of the appended claims and their equivalents.

It is noted that terms like "preferably," "commonly," and "typically," if utilized herein, should not be read to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For purposes of describing and defining the present invention it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

It is noted that recitations herein of a component being "programmed" in a particular way, "configured" or "programmed" to embody a particular property or function, are structural recitations as opposed to recitations of intended use. More specifically, the references herein to the manner in which a component is "programmed" or "configured" denotes an existing physical conditions of the component and, as such, is to be taken as a definite recitation of the structural characteristics of the component. For example, references herein to a lens assembly and an adjustable optical component being "configured" to direct a laser beam in a particular manner denotes an existing physical condition of the lens assembly and the adjustable optical component and, as such, is to be taken as a definite recitation of the structural characteristics of the lens assembly and the adjustable optical component.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A method for aligning an optical package comprising a laser, a wavelength conversion device, and at least one adjustable optical component, the method comprising:
   directing a beam spot of the laser on an input face of the wavelength conversion device using the adjustable optical component;
   measuring an output intensity of the wavelength conversion device;
   performing a first scan of the beam spot across the input face of the wavelength conversion device by oscillating the adjustable optical component about a first scanning axis at an approximate resonant frequency of a drive mechanism of the adjustable optical component;
   stepping the scan of the beam spot along an orthogonal scan line to generate a plurality of output intensities for a plurality of fast scan lines across the input face of the wavelength conversion device;
   determining a first alignment set point along the orthogonal scan line based on the plurality of output intensities for the plurality of fast scan lines;
   performing a second scan of the beam spot across the input face of the wavelength conversion device along a fast scan line containing the first alignment set point to generate an output intensity for points along the second scan, wherein the second scan is performed by oscillating the adjustable optical component about the first scanning axis at an approximate resonant frequency of the drive mechanism of the adjustable optical component;
   determining a second alignment set point along the second scan based on the output intensities generated during the second scan, wherein the first alignment set point and the second alignment set point define a position where the beam spot is aligned with the waveguide portion of the wavelength conversion device; and
   positioning the beam spot on the waveguide portion of the wavelength conversion device using the first alignment set point and the second alignment set point.

2. The method of claim 1 further comprising performing a third scan of the beam spot across the input face of the wavelength conversion device along a portion of the fast scan line containing the first alignment set point and the second alignment set point while measuring the output intensity of the wavelength conversion device, wherein a product of a speed of the third scan and a period of the third scan is less than a predetermined percentage of a mode diameter of a waveguide portion of the wavelength conversion device; and
   adjusting the second alignment set point based on the measured output intensity such that the output intensity of the wavelength conversion device is maximized.

3. The method of claim 1 wherein the optical package further comprises a lens assembly and a controller, wherein:
   the lens assembly and the adjustable optical component are configured to direct a beam spot of the laser towards an input face of the wavelength conversion device and to vary the position of the beam spot on the input face of the wavelength conversion device; and
   the controller is programmed to control a position or state of the adjustable optical component.

4. The method of claim 3 wherein the adjustable optical component is a MEMS mirror and the lens assembly and the adjustable optical component are further configured to define a folded optical path such that laser light propagating along the optical path from the laser to the wavelength conversion device is first collimated or nearly collimated by the lens assembly prior to being reflected by the adjustable optical component and is focused by the same lens assembly on the input face of the wavelength conversion device after being reflected by the MEMS mirror.

5. The method of claim 3 wherein the controller positions the beam spot on the waveguide portion of the wavelength conversion device by utilizing the first alignment set point and the second alignment set point to position the adjustable optical component.

6. The method of claim 3 wherein the optical package further comprises an optical detector coupled to the controller; and
   an output intensity of the wavelength conversion device is measured utilizing the optical detector to measure the output intensity of a wavelength-converted output of the wavelength conversion device as the position of the beam spot on the input face of the wavelength conversion device is varied.

7. The method of claim 6 wherein determining the first alignment set point and determining the second alignment set point are performed by the controller based on signals received by the controller from the optical detector.

8. The method of claim 3 wherein the beam spot is focused on the input face of the wavelength conversion device by positioning the lens assembly, the wavelength conversion device and the semiconductor laser such that the object focal plane of the lens assembly is coplanar with the input face of the wavelength conversion device and an output face of the semiconductor laser.

9. The method of claim 3 wherein oscillating the adjustable optical component about the first scanning axis at an approximate resonant frequency of the drive mechanism of the adjustable optical component is performed by utilizing the controller to control the position or state of the adjustable optical component.

10. The method of claim 3 wherein the adjustable optical component comprises at least one movable MOEMS mirror configured and arranged to vary the position of the beam spot on the input face of the wavelength conversion device.

11. The method of claim 3 wherein:
   the lens assembly comprises an adjustable lens component as the adjustable optical component; and
   the optical package further comprises a fixed mirror positioned along an optical path between the semiconductor laser and the wavelength conversion device.

12. A method for aligning an optical package comprising a laser, a wavelength conversion device, and at least one adjustable optical component, the method comprising:
   directing a beam spot of the laser on an input face of the wavelength conversion device using the adjustable optical component;
   measuring an output intensity of the wavelength conversion device;
   performing a first scan of the beam spot across the input face of the wavelength conversion device by oscillating the adjustable optical component about a first scanning axis at an approximate resonant frequency of a drive mechanism of the adjustable optical component;

stepping the scan of the beam spot along an orthogonal scan line to generate a plurality of output intensities for a plurality of fast scan lines across the input face of the wavelength conversion device;

determining a first alignment set point along the orthogonal scan line based on the plurality of output intensities for the plurality of fast scan lines by determining the fast scan line with the greatest average output intensity or determining the fast scan line with the greatest maximum output intensity;

performing a second scan of the beam spot across the input face of the wavelength conversion device along a fast scan line containing the first alignment set point to generate an output intensity for points along the second scan;

determining a second alignment set point along the second scan based on the output intensities generated during the second scan, wherein the first alignment set point and the second alignment set point define a position where the beam spot is aligned with the waveguide portion of the wavelength conversion device; and positioning the beam spot on the waveguide portion of the wavelength conversion device using the first alignment set point and the second alignment set point.

13. A method for aligning an optical package comprising a laser, a wavelength conversion device, and at least one adjustable optical component, the method comprising:

directing a beam spot of the laser on an input face of the wavelength conversion device using the adjustable optical component;

measuring an output intensity of the wavelength conversion device;

performing a first scan of the beam spot across the input face of the wavelength conversion device by oscillating the adjustable optical component about a first scanning axis at an approximate resonant frequency of a drive mechanism of the adjustable optical component;

stepping the scan of the beam spot along an orthogonal scan line to generate a plurality of output intensities for a plurality of fast scan lines across the input face of the wavelength conversion device;

determining a first alignment set point along the orthogonal scan line based on the plurality of output intensities for the plurality of fast scan lines;

performing a second scan of the beam spot across the input face of the wavelength conversion device along a fast scan line containing the first alignment set point to generate an output intensity for points along the second scan;

determining a second alignment set point along the second scan based on the output intensities generated during the second scan by determining a point with the greatest output intensity based on the output intensities generated during the second scan, wherein the first alignment set point and the second alignment set point define a position where the beam spot is aligned with the waveguide portion of the wavelength conversion device;

interpolating the second alignment set point along the fast scan line containing the first alignment set point such that the output intensity of the wavelength conversion device is maximized; and positioning the beam spot on the waveguide portion of the wavelength conversion device using the first alignment set point and the second alignment set point.

14. A method for aligning an optical package comprising a laser, a wavelength conversion device, and at least one adjustable optical component, the method comprising:

directing a beam spot of the laser on an input face of the wavelength conversion device using the adjustable optical component;

focusing the beam spot on the input face of the wavelength conversion device;

measuring an output intensity of the wavelength conversion device;

performing a relatively rapid scan of the beam spot across the input face of the wavelength conversion device by oscillating the adjustable optical component about a first scanning axis at an approximate resonant frequency of a drive mechanism of the adjustable optical component;

stepping the relatively rapid scan of the beam spot along an orthogonal scan line to generate a plurality of output intensities for a plurality of fast scan lines;

determining a first alignment set point along the orthogonal scan line based on the plurality of output intensities for the plurality of fast scan lines;

performing a relatively slow scan of the beam spot across the input face of the wavelength conversion device along the fast scan line containing the first alignment set point by adjusting a position or state of the adjustable optical component thereby generating a plurality of output intensities for a plurality of points along the fast scan line containing the first alignment set point;

determining a second alignment set point along the fast scan line containing the first alignment set point based on the plurality of output intensities generated during the second scan;

performing a third scan of the beam spot across the input face of the wavelength conversion device along a portion of the fast scan line containing the first alignment set point and the second alignment set point while measuring the output intensity of the wavelength conversion device, wherein a product of a speed of the third scan and a period of the third scan is less than a predetermined percentage of a mode diameter of a waveguide portion of the wavelength conversion device;

adjusting the second alignment set point based on the output intensity of the wavelength conversion device measured during the third scan such that the output intensity of the wavelength conversion device is maximized; and positioning the beam spot on the waveguide portion of the wavelength conversion device with the adjustable optical component using the first alignment set point and the second alignment set point.

15. An optical system comprising a laser, a wavelength conversion device, a lens assembly, at least one MEMS mirror, an optical detector, and a controller, wherein the wavelength conversion device comprises a waveguide portion and an input face, the optical detector is coupled to the controller and positioned to measure the output intensity of the wavelength conversion device, the lens assembly and the MEMS mirror are configured to direct a beam spot of the laser towards the input face of the wavelength conversion device along a folded optical path, and the controller is programmed to:

cooperate with the MEMS mirror to control a position or state of the MEMS mirror along a first scanning axis and a second scanning axis such that the beam spot may be positioned along the input face of the wavelength conversion device;

cooperate with the adjustable optical component to perform a first scan of the beam spot across the input face of the wavelength conversion device by oscillating the position or state of the MEMS mirror about the first scanning axis at an approximate resonant frequency of the MEMS mirror;

cooperate with the MEMS mirror to step the first scan of the beam spot along an orthogonal scan line on the input face of the wavelength conversion device by rotating the MEMS mirror about the second scanning axis, wherein stepping the first scan of the beam spot along the orthogonal scan line generates a plurality of output intensities for a plurality of fast scan lines;

determine a first alignment set point along the orthogonal scan line based on the plurality of output intensities for the plurality of fast scan lines;

cooperate with the MEMS mirror to perform a second scan of the beam spot across the input face of the wavelength conversion device along the fast scan line containing the first alignment set point by rotating the MEMS mirror about the first scanning axis thereby generating a plurality of output intensities for a plurality of points along the second scan;

determine a second alignment set point along the fast scan line containing the first alignment set point based on the plurality of output intensities generated during the second scan; and cooperate with the MEMS mirror to position the MEMS mirror on the first scanning axis and the second scanning axis using the first alignment set point and the second alignment set point such that the beam spot is positioned on the waveguide portion of the wavelength conversion device.

16. The system of claim 15 wherein the controller cooperates with the MEMS mirror to perform the second scan by oscillating the MEMS mirror about the first scanning axis at an approximate resonant frequency of the drive mechanism of the MEMS mirror.

17. The system of claim 15 wherein the controller cooperates with the MEMS mirror to perform the first scan such that the first scan is a relatively rapid scan and the controller cooperates with the MEMS mirror to perform the second scan such that the second scan is a relatively slow scan.

18. The system of claim 17 wherein the second scan of the beam spot over the fast scan line containing the first alignment set point is performed by positioning the MEMS mirror such that the beam spot is positioned at discrete points along the fast scan line containing the first alignment set point.

* * * * *